(12) United States Patent
Leobandung et al.

(10) Patent No.: US 9,893,489 B2
(45) Date of Patent: Feb. 13, 2018

(54) WAFER SCALE MONOLITHIC INTEGRATION OF LASERS, MODULATORS, AND OTHER OPTICAL COMPONENTS USING ALD OPTICAL COATINGS

(71) Applicant: INTERNATIONAL BUSINESS MACHINES CORPORATION, Armonk, NY (US)

(72) Inventors: Effendi Leobandung, Stormville, NY (US); Ning Li, White Plains, NY (US); Jean-Oliver Plouchart, New York, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/226,149

(22) Filed: Aug. 2, 2016

(65) Prior Publication Data

US 2017/0063028 A1    Mar. 2, 2017

Related U.S. Application Data

(62) Division of application No. 14/838,439, filed on Aug. 28, 2015.

(51) Int. Cl.
*H01S 5/026* (2006.01)
*H01S 5/02* (2006.01)
*H01S 5/028* (2006.01)

(52) U.S. Cl.
CPC ............ *H01S 5/021* (2013.01); *H01S 5/0265* (2013.01); *H01S 5/0287* (2013.01); *H01S 2301/176* (2013.01)

(58) Field of Classification Search
CPC ....... H01S 5/021; H01S 5/0265; H01S 5/0287
See application file for complete search history.

(56) References Cited

U.S. PATENT DOCUMENTS

| 5,321,253 A | 6/1994 | Gorfinkel et al. |
| 5,851,849 A | 12/1998 | Comizzoli et al. |

(Continued)

FOREIGN PATENT DOCUMENTS

| JP | 3636311 B2 | 4/2005 |
| JP | 4918913 B2 | 4/2012 |

OTHER PUBLICATIONS

U.S. Office Action dated Aug. 1, 2016 received in U.S. Appl. No. 14/838,439.

(Continued)

*Primary Examiner* — Michael Carter
(74) *Attorney, Agent, or Firm* — Scully, Scott, Murphy & Presser, P.C.; Louis J. Percello, Esq.

(57) ABSTRACT

After forming a monolithically integrated device including a laser and a modulator on a semiconductor substrate, an anti-reflection coating layer is formed over the monolithically integrated device and the semiconductor substrate by an atomic layer deposition (ALD) process. The anti-reflection coating layer is lithographically patterned so that an anti-reflection coating is only present on exposed surfaces of the modulator. After forming an etch stop layer portion to protect the anti-reflection coating, a high reflection coating layer is formed over the etch stop layer, the laser and the semiconductor structure by ALD and lithographically patterned to provide a high reflection coating that is formed solely on a non-output facet of the laser.

17 Claims, 9 Drawing Sheets

(56) References Cited

U.S. PATENT DOCUMENTS

| | | | |
|---|---|---|---|
| 6,574,259 B1 | 6/2003 | Fish et al. | |
| 6,835,581 B2 | 12/2004 | Fitz et al. | |
| 7,173,953 B2 | 2/2007 | Wittmann et al. | |
| 7,355,782 B2 | 4/2008 | Miles | |
| 8,313,963 B2 | 11/2012 | Pan | |
| 9,020,002 B2 | 4/2015 | Sysak et al. | |
| 2002/0175336 A1* | 11/2002 | Choi | H01S 5/028 257/88 |
| 2004/0062282 A1* | 4/2004 | Matsuoka | B82Y 20/00 372/26 |
| 2004/0169189 A1 | 9/2004 | Jeon | |
| 2009/0117676 A1* | 5/2009 | Katsuyama | B82Y 20/00 438/24 |
| 2011/0312177 A1 | 12/2011 | Lin et al. | |
| 2012/0281723 A1* | 11/2012 | Oh | H01S 5/02248 372/20 |
| 2013/0285067 A1* | 10/2013 | Bethoux | H01L 21/76254 257/76 |
| 2014/0167198 A1 | 6/2014 | Hoenk et al. | |
| 2014/0219305 A1 | 8/2014 | Fang et al. | |
| 2015/0372456 A1 | 12/2015 | Pourhashemi et al. | |
| 2016/0087153 A1 | 3/2016 | Terashima et al. | |

OTHER PUBLICATIONS

List of IBM Patents or Patent Applications Treated as Related, dated Aug. 2, 2016, 2 pages.
U.S. Office Action dated Jun. 26, 2017 received in related U.S. Appl. No. 14/838,439.

\* cited by examiner

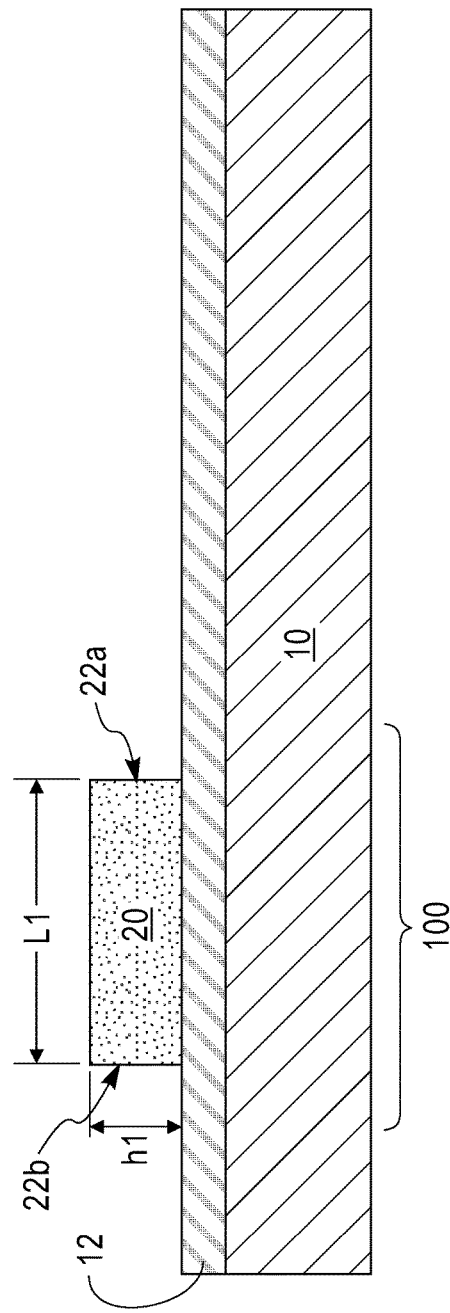
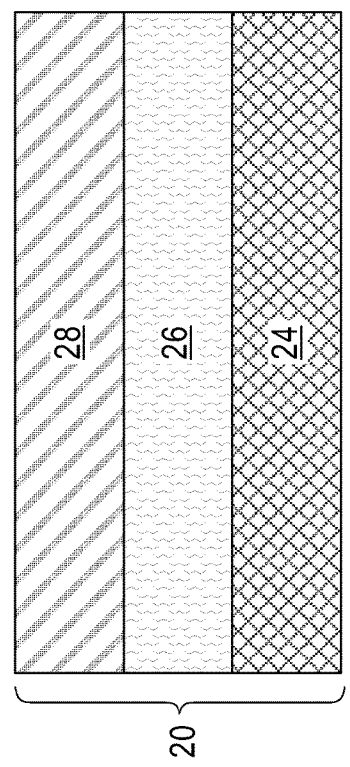

WAFER SCALE MONOLITHIC INTEGRATION OF LASERS, MODULATORS, AND OTHER OPTICAL COMPONENTS USING ALD OPTICAL COATINGS

BACKGROUND

The present application relates to semiconductor technology, and more particularly to forming optical coatings on optical components that are monolithically integrated on a single semiconductor substrate in a wafer scale process.

High-speed, low-chirp, low power consumption semiconductor lasers and modulators are important components for the next generation of optical networks. Monolithic integration of modulators with lasers on a single integrated chip has been shown to increase the modulation speed and reduce the laser chirp and noise. Different types of optical coating are needed to reduce the optical loss of optical components in the monolithically integrated device. For example, the modulator typically requires an anti-reflection coating so that light emitted from the laser can be coupled effectively into the modulator, while the laser typically requires a high reflection coating on the laser non-output facet so that light incident on the non-output facet can be reflected back into the laser. In the prior art, the fabrication of different types of optical coatings on optical components are for a single row of devices, and thus are not compatible with the monolithic integration scheme in a wafer scale process. As such, there remains a need for a method that allows selectively depositing different types of optical coatings on monolithically integrated optical components in a wafer scale process.

SUMMARY

The present application provides a method that allows selectively depositing different types of optical coatings on monolithically integrated optical components in a wafer scale process. After forming a monolithically integrated device including a laser and a modulator on a semiconductor substrate, an anti-reflection coating layer is formed over the monolithically integrated device and the semiconductor substrate by an atomic layer deposition (ALD) process. The anti-reflection coating layer is lithographically patterned so that an anti-reflection coating is only present on exposed surfaces of the modulator. After forming an etch stop layer portion to protect the anti-reflection coating, a high reflection coating layer is formed over the etch stop layer, the laser and the semiconductor structure by ALD and lithographically patterned to provide a high reflection coating that is formed solely on a non-output facet of the laser.

In one aspect of the present application, a semiconductor structure is provided. The semiconductor structure includes a laser located in a first region of a semiconductor substrate. The laser has a first facet on a first end of the laser through which a laser beam is emitted and a second facet on a second end of the laser opposite the first end. The semiconductor structure further includes a modulator located in a second region of the semiconductor substrate and optically coupled to the laser, an anti-reflection coating present on exposed surfaces of the modulator, and a high reflection coating present on the second facet of the laser.

In another aspect of the present application, a method of forming a semiconductor structure is provided. The method includes first providing a laser in a first region of a semiconductor substrate and a modulator in a second region of the semiconductor substrate and optically coupled to the laser. The laser has a first facet on a first end of the laser through which a laser beam is emitted and a second facet on a second end of the laser opposite the first end. An anti-reflection coating is then formed on exposed surfaces of the modulator. Next, a high reflection coating is formed on the second facet of the laser.

BRIEF DESCRIPTION OF SEVERAL VIEWS OF THE DRAWINGS

FIG. 1 is a cross-sectional view of an exemplary semiconductor structure including a laser located on a first portion of a semiconductor substrate in accordance with an embodiment of the present application.

FIG. 2 illustrates components of the laser of FIG. 1 in accordance with an embodiment of the present application.

DETAILED DESCRIPTION

Figure 3:
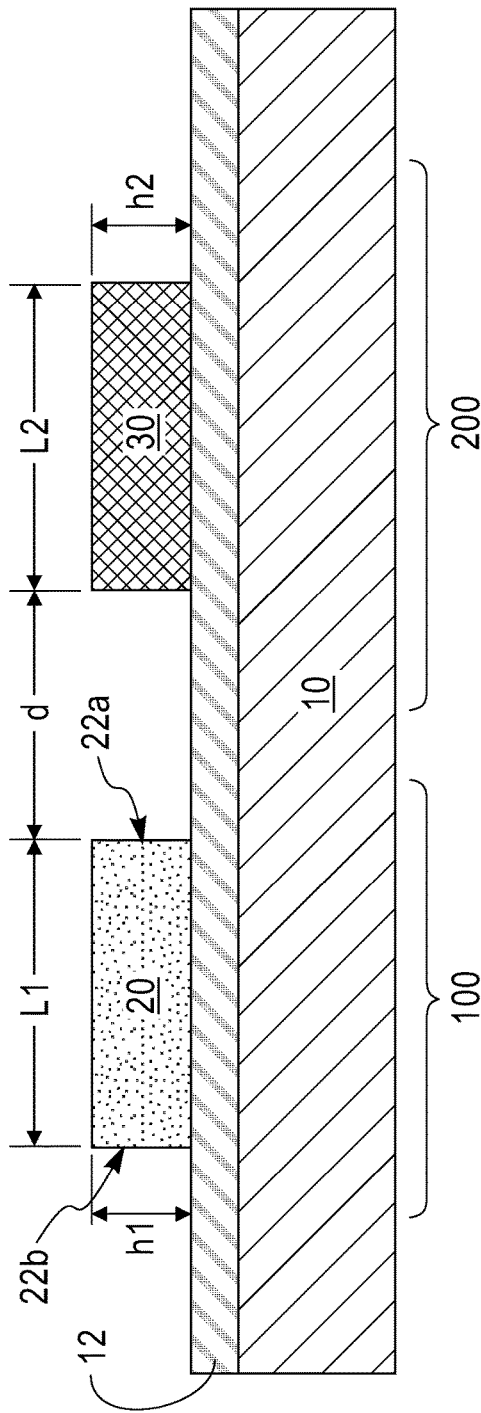
FIG. 3 is a cross-sectional view of the exemplary semiconductor structure of FIG. 1 after forming a modulator in a second region of the semiconductor substrate.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring now to FIG. 1, there is illustrated an exemplary semiconductor structure including a laser 20 located in a first region 100 of a semiconductor substrate 10.

The semiconductor substrate 10 may include any semiconductor material such as, for example, silicon (Si), germanium (Ge), a silicon germanium (SiGe) alloy, SiGeC, SiC, an III-V compound semiconductor or an II-VI compound semiconductor. Multilayers of these semiconductor materials can also be used as the semiconductor material of semiconductor substrate 10. The thickness of the semiconductor substrate 10 can be from 50 μm to 2 mm, although lesser and greater thicknesses can also be employed.

The semiconductor substrate 10 may have any crystal orientation including, for example, {100}, {110} or {111}. In some embodiments, the semiconductor substrate 10 may be a single crystalline semiconductor material. Typically, and in one embodiment of the present application, the semiconductor substrate 10 is single crystal silicon. In other embodiments, the semiconductor substrate 10 is a polycrystalline semiconductor material such as, for example, polycrystalline silicon.

In one embodiment and when the semiconductor substrate 10 is composed of silicon, a semiconductor seed layer 12 may be formed on top of the semiconductor substrate 10. The semiconductor seed layer 12 may include Ge or SiGe and may be deposited utilizing an epitaxial growth (or deposition) process including molecular beam epitaxy (MBE) or metal-organic chemical vapor deposition (MOCVD) so that the semiconductor seed layer 12 is epitaxially aligned with the semiconductor substrate 10. By "epitaxially aligned" it is meant that the semiconductor seed layer 12 has a same crystal orientation as that of the semiconductor substrate 10. The thickness of the semiconductor seed layer 12 that is formed can be from 10 nm to 100 nm, although lesser and greater thicknesses can also be employed.

The laser 20 has an output facet 22a located at a first end of the laser 20 through which the laser beam is emitted and a non-output facet 22b located at a second end of the laser 20 opposite the first end. In one embodiment and as shown in FIG. 2, the laser 20 may include, for bottom to top, a first bottom cladding layer 24, a first active layer 26 and a first top cladding layer 28. The first active layer 26 is layer within which light is emitted by recombination of carriers. The first bottom cladding layer 24 and the from top cladding layer 28 are layers for increasing a carrier density in the first active layer 26.

The first bottom cladding layer 24 may include an III-V compound semiconductor material. In one embodiment, the first bottom cladding layer 24 comprises AlGaAs. The semiconductor material that provides the first bottom cladding layer 24 may be of a first conductivity type (p-type or n-type). The p-type dopants comprise a group II element such as Mg, Zn, Ca, Sr, or Ba. The n-type dopants comprise a group IV element such as Si, Ge, Sn, Se, or Te. The first bottom cladding layer 24 may be formed utilizing an epitaxially growth process such as, for example, MBE or MOCVD. The first bottom cladding layer 24 that is formed is epitaxially aligned with the semiconductor seed layer 12.

The first active layer 26 may include an III-V compound semiconductor material. In one embodiment, the first active layer 26 comprises GaAs. Alternatively, the first active layer 26 may be formed with a single quantum well structure or a multi quantum well structure. In one embodiment, the first active layer 26 comprises a quantum well layer formed of $In_xGa_{1-x}N$ and a quantum barrier layer formed of GaN alternately. Here, x is adjusted through $0 \leq x \leq 1$. The first active layer 26 can be formed utilizing an epitaxial growth process such as, for example, MBE or MOCVD. The first active layer 26 that is formed is epitaxially aligned with the first bottom cladding layer 24.

The first top cladding layer 28 may include an III-V compound semiconductor material that is the same as, or different from, the first bottom cladding layer 24. In one embodiment, the first top cladding layer 28 comprises AlGaAs. The semiconductor material that provides the first top cladding layer 28 may be of a second conductivity type opposite the first conductivity type. The first top cladding layer 28 can be formed utilizing an epitaxial growth process such as, for example, MBE or MOCVD. The first top cladding layer 28 that is formed is epitaxially aligned with the first active layer 26.

The laser 20 can be formed by first forming a material stack of the first bottom cladding layer 24, the first active layer 26 and the first top cladding layer 28 over the semiconductor substrate 10 or the semiconductor seed layer 12, if present, and lithographically patterning the material stack (24, 26, 28). The lithographic patterning of the material stack (24, 26, 28) can be performed by a dry etch, such as, for example, reactive ion etching (RIE) to define the output facet 22a and the non-output facet 22b of the laser 20. The laser 20 that is formed may have a length, L1, of about 500 μm and a height, h1, of about 3 μm.

Referring to FIG. 3, there is illustrated the exemplary semiconductor structure of FIG. 1 after forming a modulator 30 in a second region 200 of the semiconductor substrate 10. A monolithically integrated device including the laser 20 and the modulator 30 is thus formed. The modulator 30 may have a length, L2, of about 500 μm and a height, h2, of about 3 μm. The distance, d, between the laser 20 and the modulator 30 is less than 1 μm to ensure that the light emitted from the laser 20 can be coupled into the modular 30.

Figure 4:
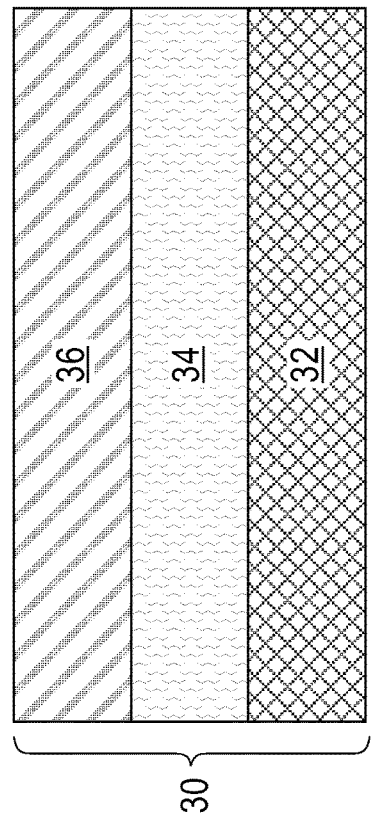
FIG. 4 illustrates components of the modular of FIG. 3 in accordance with an embodiment of the present application.

In one embodiment and as shown in FIG. 4, the modulator 30 may include, from bottom to top, a second bottom cladding layer 32, a second active layer 34 and a second top cladding layer 36. The second bottom cladding layer 32 and the second top cladding layer 36 are formed of a III-V compound semiconductor material, respectively. The second bottom cladding layer 32 has, for example, the first conductivity type (for example, n-type). The second top cladding layer 36 has a second conductivity type (for example, p-type) opposite the first conductivity type. In one embodiment, the second bottom cladding layer 32 is composed of an n-type InP, while the second top cladding layer 36 is composed of a p-type InP. The second active layer 34 may have a quantum well structure comprising InGaAsP layers (not shown) separated by at least one InP barrier layer (not shown).

The modulator 30 can be formed by first applying a dielectric oxide layer (not shown) over the semiconductor substrate 10 or the semiconductor seed layer 12, if present, and etching the dielectric oxide layer to expose the second region 200 of the semiconductor substrate 10 by an anisotropic etch. The anisotropic etch can be a dry etch such as, for example, reactive ion etching or a wet chemical etch. After etching the dielectric oxide layer, the laser 20 in the first region 100 remains covered by the dielectric oxide layer. Subsequently, the second bottom cladding layer 32, the second active layer 34 and the second top cladding layer 36 that constitute the modulator 30 are epitaxially grown on the exposed surface of the semiconductor substrate 10 or the semiconductor seed layer 12, if present, sequentially.

In another embodiment, the laser 20 and the modular 30 can be monolithically integrated by a wafer bonding process known in the art.

In the present application, although two types of optical components, i.e., laser 20 and modulator 30, are described and illustrated, other types of optical components (e.g., photodetector, waveguide) can also be formed on the semiconductor substrate 10 and integrated with the laser 20 and/or the modulator 30 of the present application.

Figure 5:
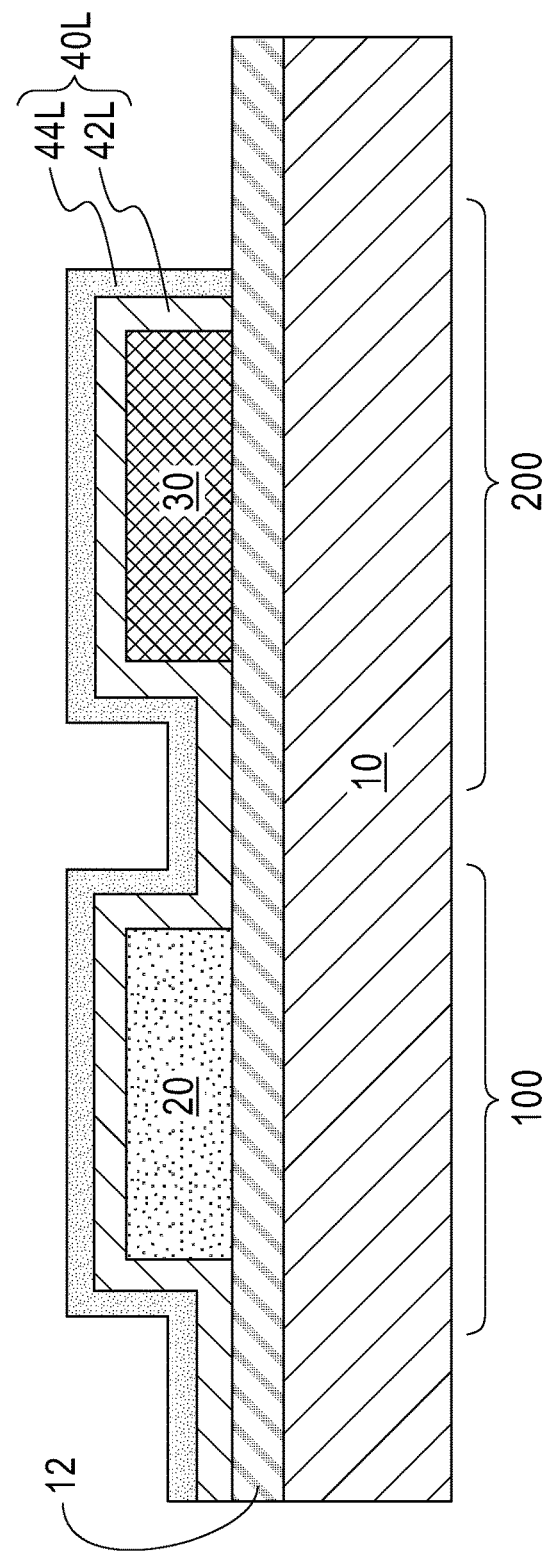
FIG. 5 is a cross-sectional view of the exemplary semiconductor structure of FIG. 3 after forming an anti-reflection coating layer over the laser, the modulator and the semiconductor substrate.

Referring to FIG. 5, there is illustrated the exemplary semiconductor structure of FIG. 3 after forming an anti-reflection coating layer 40L over the laser 20, the modulator 30 and exposed surface of the semiconductor substrate 10 or the semiconductor seed layer 12, if present. The anti-reflection coating layer 40L may include a stack of alternating layers of different refractive indices. In one embodiment and as shown in FIG. 5, the anti-reflection coating layer 40L includes a first coating layer 42L having a high refractive index and a second coating layer 44L having a low refractive index overlying the first dielectric layer 42L. For example, the first coating layer 42L may have a refractive index of at least 1.85 and can be formed of silicon nitride (SiN), hafnium oxide ($HfO_2$), titanium nitride (TiN), tantalum oxide ($Ta_2O_5$) or titanium oxide ($TiO_2$). The second coating layer 44L may have a refractive index of less than 1.8 and can be formed of silicon dioxide ($SiO_2$), aluminum oxide ($Al_2O_3$), or silicon oxynitride (SiON). In one embodiment, the anti-reflection coating layer 40L is composed of a SiN first coating layer 42L and a $SiO_2$ second coating layer 44L. Although the anti-reflection coating layer 40L illustrated in FIG. 5 is formed of a pair of coating layers 42L, 44L, the number of pairs of the coating layers 42L, 44L is not limited thereto. More layers of the first coating layer 42L and the second coating layer 44L can be alternately superposed so far as a necessary transmittance is obtained in the anti-reflection coating layer 40L.

The first coating layer 42L and the second coating layer 44L of the anti-reflection coating layer 40L may be formed by atomic layer deposition (ALD). The ALD process allows a very accurate control of film thickness and film quality. The first coating layer 42L that is formed may have a thickness from 15 nm to 50 nm, although lesser and greater thicknesses can also be employed. The second coating layer 44L that is formed may have a thickness from 160 nm to 200 nm, although lesser and greater thicknesses can also be employed.

Figure 6:
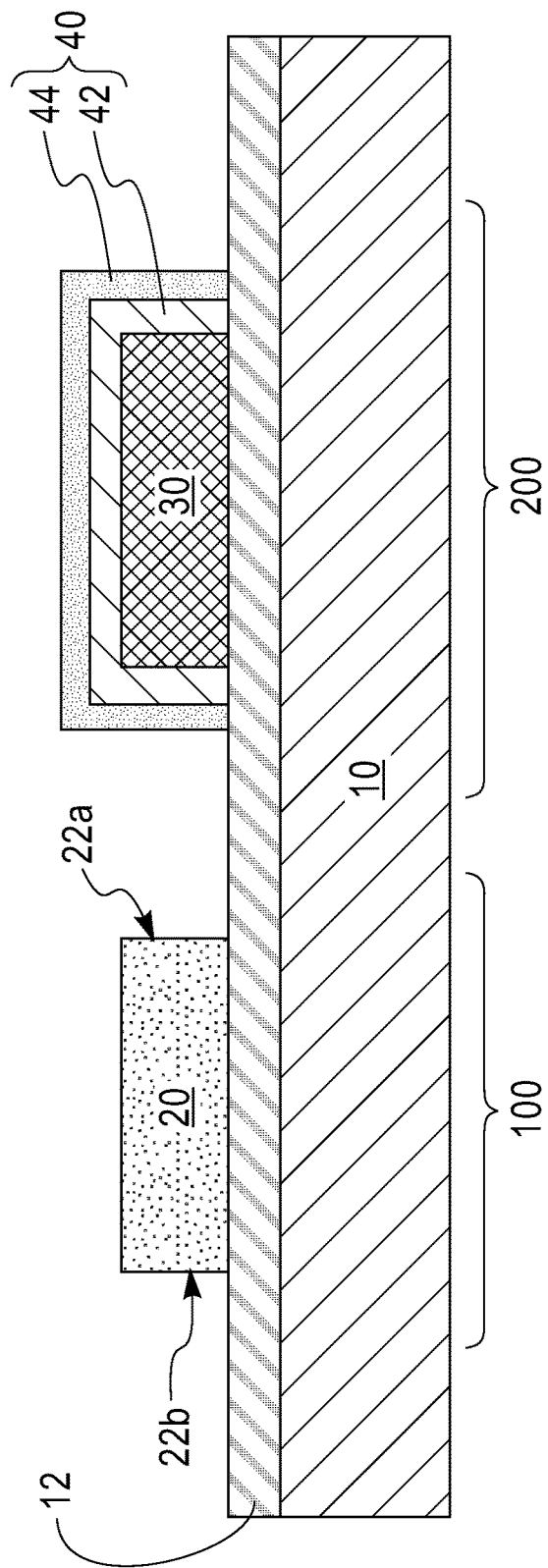
FIG. 6 is a cross-sectional view of the exemplary semiconductor structure of FIG. 5 after forming an anti-reflection coating over exposed surfaces of the modulator.

Referring to FIG. 6, there is illustrated the exemplary semiconductor structure of FIG. 5 after forming an anti-reflection coating 40 over exposed surfaces of the modulator 30. A first mask layer (not shown) is first applied over the anti-reflection coating layer 40L. The first mask layer can be a photoresist layer or a photoresist layer in conjunction with hardmask layer(s). The first mask layer is then lithographically patterned to form openings therein. The openings expose portions of the anti-reflection coating layer 40L that are not present on the exposed surfaces of the modulator 30. A remaining portion of the mask layer constitutes a patterned first mask layer.

Subsequently, portions of the anti-reflection coating layer 40L that are not covered by the patterned first mask layer are removed. An anisotropic etch, which can be a dry etch such as RIE or a wet chemical etch may be performed to remove the materials of first coating layer 42L and the second coating layer 44L in the anti-reflection coating layer 40L selective to materials of the lasers 20 and the semiconductor substrate 10 or the semiconductor seed layer 12, if present. The portion of the anti-reflection coating layer 40L that remains on the modulator 30 constitutes the anti-reflection coating 40. The anti-reflection coating 40 comprises a first coating 42 which is a remaining portion of the first coating layer 42L and a second coating 44 which is a remaining portion of the second coating layer 44L. The anti-reflection coating 40 that is formed on the exposed surfaces (i.e., a top surface and input and output surfaces) of the modulator 30 can effectively decreases light reflection and hence improving transmission of the modulator 30. Upon formation of the anti-reflection coating 40, the patterned first mask layer can be removed, for example, by oxygen-based plasma etching.

Figure 7:
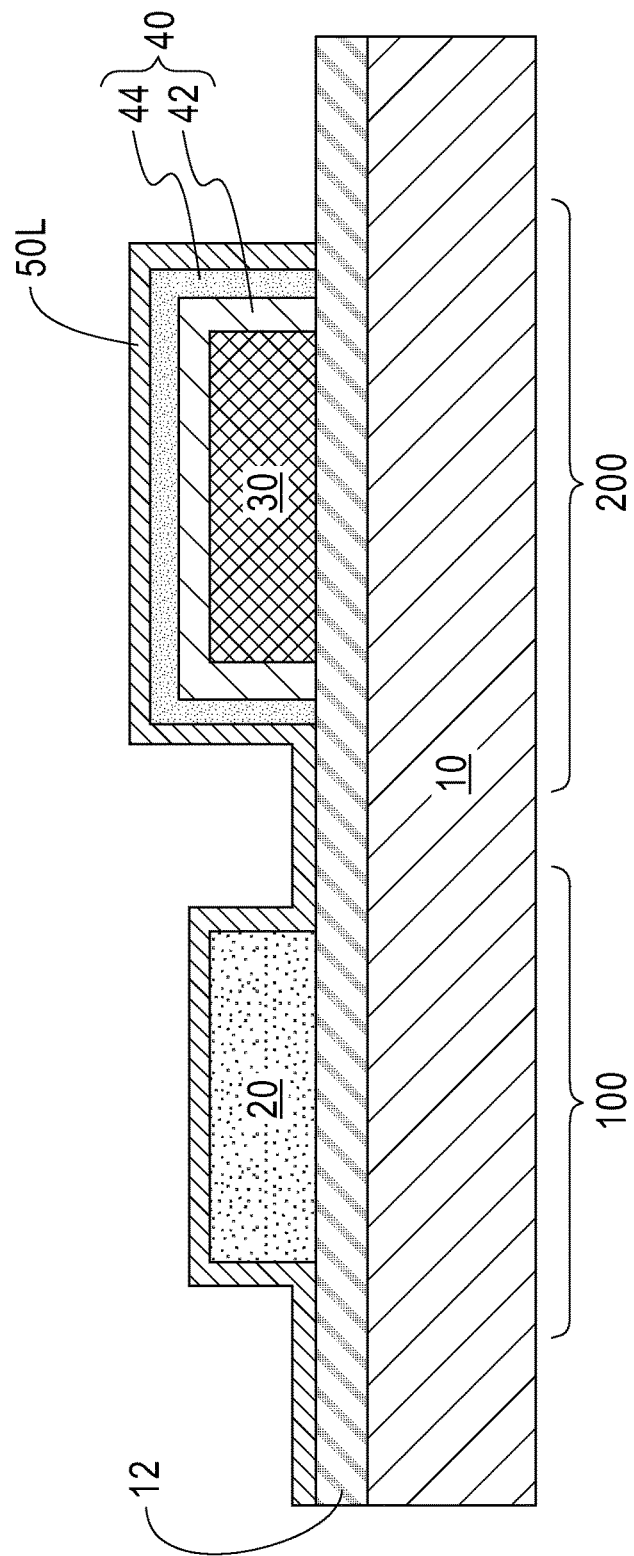
FIG. 7 is a cross-sectional view of the exemplary semiconductor structure of FIG. 6 after forming an etch stop layer over the anti-reflection coating, the laser and the semiconductor substrate.

Referring to FIG. 7, there is illustrated the exemplary semiconductor structure of FIG. 6 after forming an etch stop layer 50L over the anti-reflection coating 40, the laser 20 and the semiconductor substrate 10 or the semiconductor seed layer 12, if present. The etch stop layer 50L may include a semiconductor material such as, for example, amorphous silicon, or a metal such as, for example, copper (Cu) or titanium nitride (TiN). The etch stop layer 50L may be depositing using a conventional deposition process such as, for example, chemical vapor deposition (CVD), physical vapor deposition (PVD), plasma enhanced chemical vapor deposition (PECVD) or ALD. The etch stop layer 50L that is formed may have a thickness from 10 nm to 50 nm, although lesser and greater thickness can also be employed.

Figure 8:
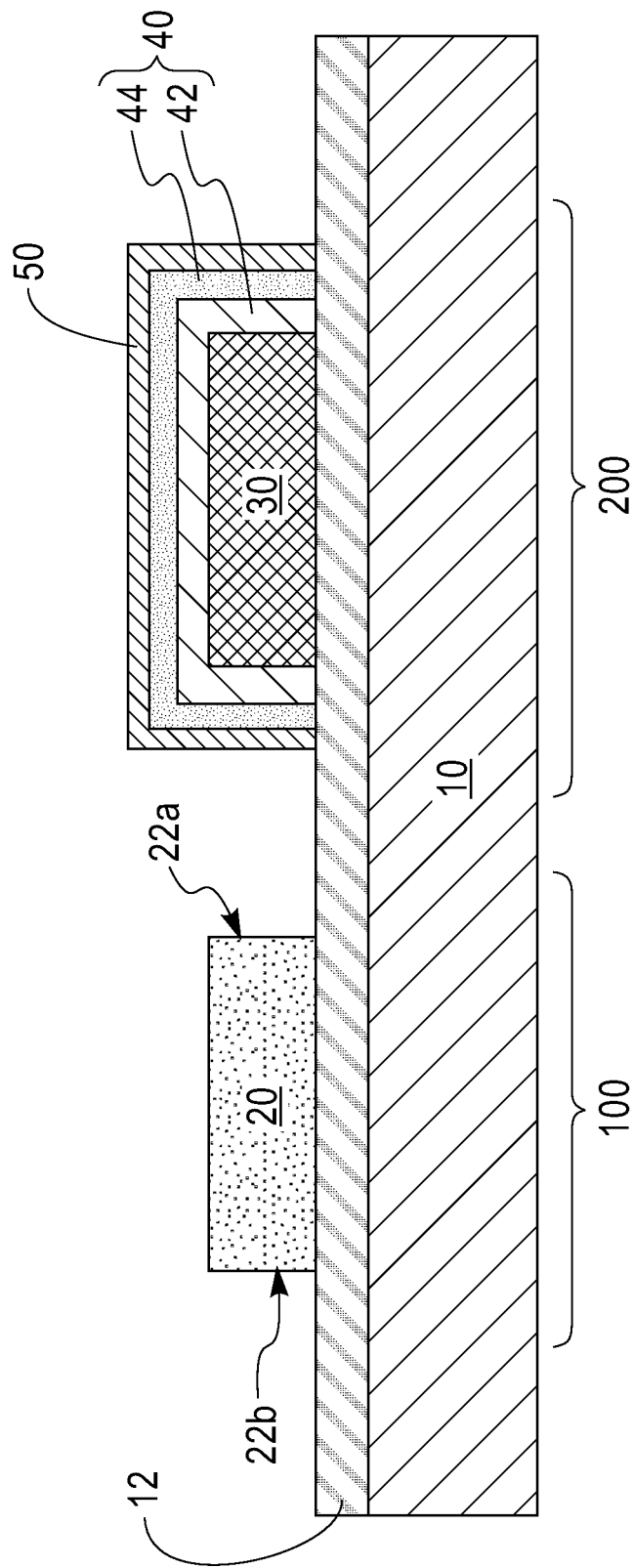
FIG. 8 is a cross-sectional view of the exemplary semiconductor structure of FIG. 7 after forming an etch stop layer portion over the anti-reflection coating.

Referring to FIG. 8, there is illustrated the exemplary semiconductor structure of FIG. 6 after removing portions of the etch stop layer 50L that are not present on the anti-reflection coating 40 to provide an etch stop layer portion 50. The etch stop layer portion 50 protects the underlying anti-reflection coating 40 during the subsequent processing steps. A second mask layer (not shown) is first applied over the etch stop layer 50L. The second mask layer can be a photoresist layer or a photoresist layer in conjunction with hardmask layer(s). The second mask layer is then lithographically patterned to form openings therein. The openings expose portions of the etch stop layer 50L that are not present on the anti-reflection coating 40. A remaining portion of the mask layer constitutes a patterned second mask layer.

Subsequently, portions of the etch stop layer 50L that are not covered by the patterned second mask layer are removed. An anisotropic etch, which can be a dry etch such as RIE or a wet chemical etch, may be performed to remove the material of etch stop layer 50L selective to materials of the lasers 20 and the semiconductor substrate 10 or the semiconductor seed layer 12, if present. The portion of the etch stop layer 50L that remains on the anti-reflection coating 40 constitutes the etch stop layer portion 50. Upon formation of the etch stop layer portion 50, the patterned second mask layer can be removed, for example, by oxygen-based plasma etching.

Figure 9:
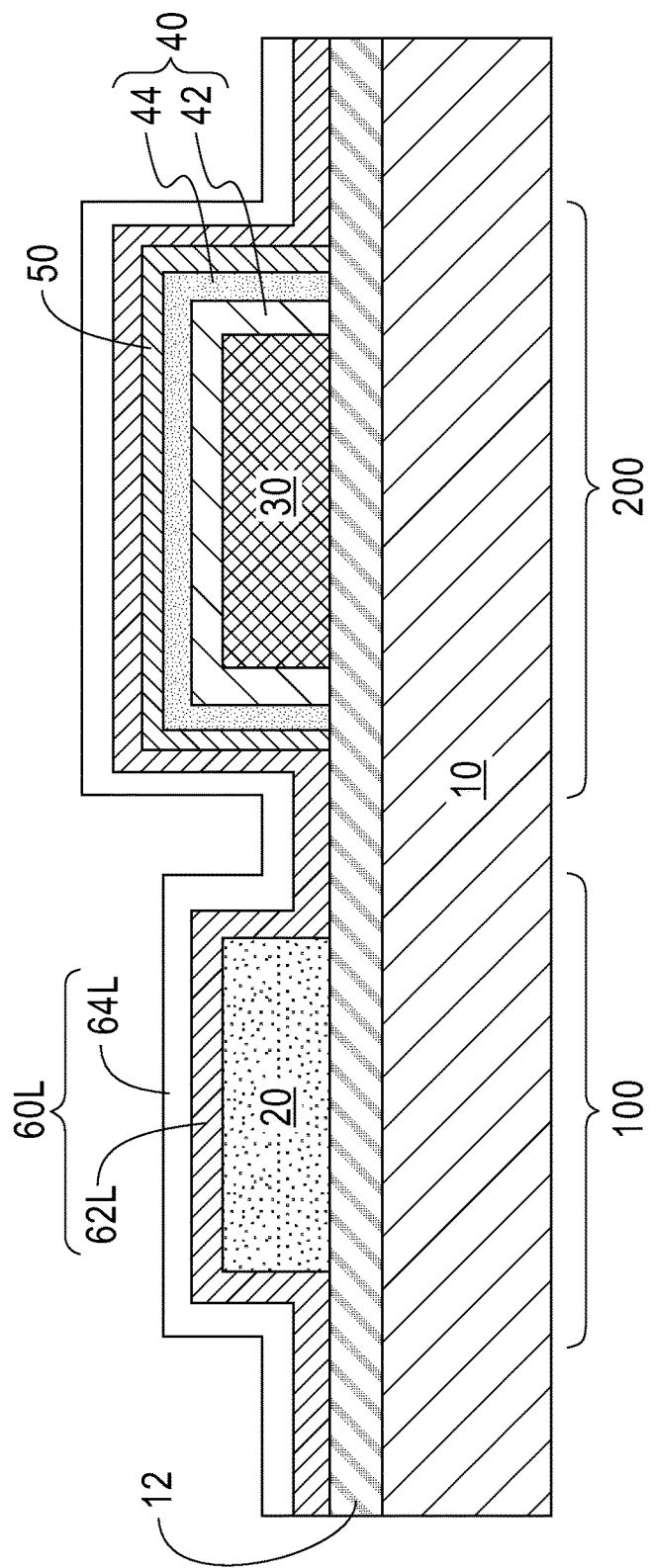
FIG. 9 is a cross-sectional view of the exemplary semiconductor structure of FIG. 8 after forming a high reflection coating layer over the laser, the etch stop layer portion and the semiconductor substrate.

Referring to FIG. 9, there is illustrated the exemplary semiconductor structure of FIG. 8 after forming a high reflection coating layer 60L over the laser 20, the etch stop layer portion 50 and exposed surface of the semiconductor substrate 10 or the semiconductor seed layer 12, if present. The high reflection coating layer 60L typically has a reflectance of not less than 70%, more preferably not less than 90%. The high reflection coating layer 60L may include a stack of alternating layers of different refractive indices. In one embodiment and as shown in FIG. 9, the high reflection coating layer 60L includes a third coating layer 62L having a low refractive index and a fourth coating layer 64L having a high refractive index. Exemplary low refractive index materials include, but are not limited to $SiO_2$, $Al_2O_3$ or SiON. Exemplary high refractive index materials include, but are not limited to SiN, $HfO_2$, TiN, $Ta_2O_5$ or $TiO_2$. For example, the third coating layer 62L may include $SiO_2$, while the fourth coating layer 64L may include $Ta_2O_5$.

Although the high reflection coating layer 60L illustrated in FIG. 9 is formed of a pair of coating layers 62L, 64L, the number of pairs of the coating layers 62L, 64L is not limited thereto. More layers of the third coating layer 62L and the fourth coating layer 64L can be alternately superposed so far as a necessary reflectance is obtained in the high reflection coating layer 60L.

The respective coating layers (i.e., the third coating layer 62L and the fourth coating layer 64L may be formed by ALD. The thickness (t) of each of the third coating layer 62L and the fourth coating layer 64L is set to satisfy the following equation: t<λ/4n, wherein λ is an oscillation wavelength of a laser beam; n is refractive index of a coating layer.

Figure 10:
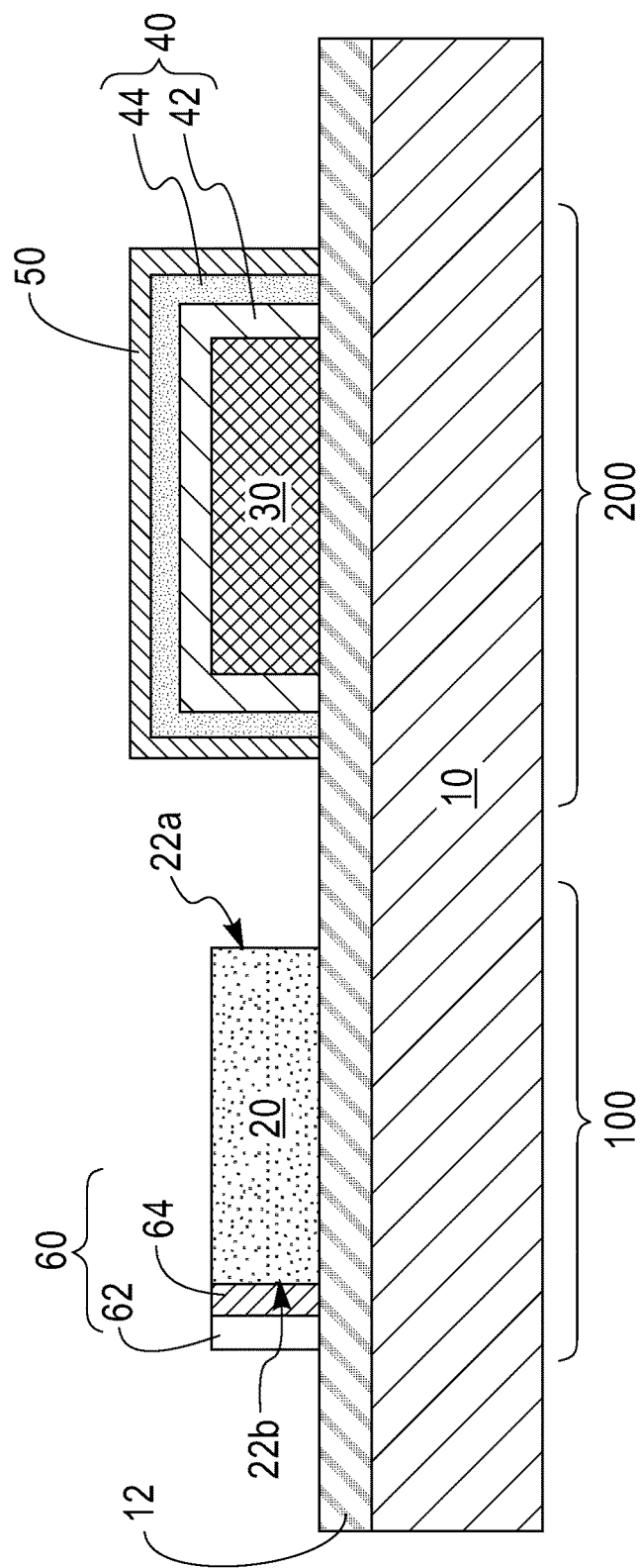
FIG. 10 is a cross-sectional view of the exemplary semiconductor structure of FIG. 9 after forming a high reflection coating over a non-output facet of the laser.

Referring to FIG. 10, there is illustrated the exemplary semiconductor structure of FIG. 9 after forming a high reflection coating 60 over the non-output facet 22b of the laser 20. A third mask layer (not shown) is first applied over the high reflection coating layer 60L. The third mask layer can be a photoresist layer or a photoresist layer in conjunction with hardmask layer(s). The third mask layer is then lithographically patterned to form openings therein. The openings expose portions of the high reflection coating layer 60L that are not present on the non-output facet 22b of the laser 20. A remaining portion of the third mask layer constitutes a patterned third mask layer.

Subsequently, portions of the high reflection coating layer 60L that are not covered by the patterned third mask layer are removed. An anisotropic etch, which can be a dry etch such as RIE or a wet chemical etch, may be performed to remove the materials of the third coating layer 62L and the fourth coating layer 64L in the high reflection coating layer 60L selective to materials of the lasers 20, the etch stop layer portion 50 and the semiconductor substrate 10 or the semiconductor seed layer 12, if present. The portion of the high reflection coating layer 60L that remains on the non-output facet 22b of the laser 20 constitutes the high reflection coating 60. In one embodiment, the high reflection coating 60 comprises a third coating 62 which is a remaining portion of the third coating layer 62L and a fourth coating 64 which is a remaining portion of the fourth coating layer 64L. Upon formation of the high reflection coating 60, the patterned third mask layer can be removed, for example, by oxygen-based plasma etching.

The high reflection coating 60 that remains on the non-output facet 22b of the laser 20 causes the laser beam that is incident on the non-output facet 22b to be reflected back to the laser 20 and ultimately out of the output facet 22a of the laser 20, thus effectively suppressing the optical loss due to the light absorption by the non-output facet 22b of the laser 20. As a result, the stability and efficiency of the laser 20 can be improved.

Figure 11:
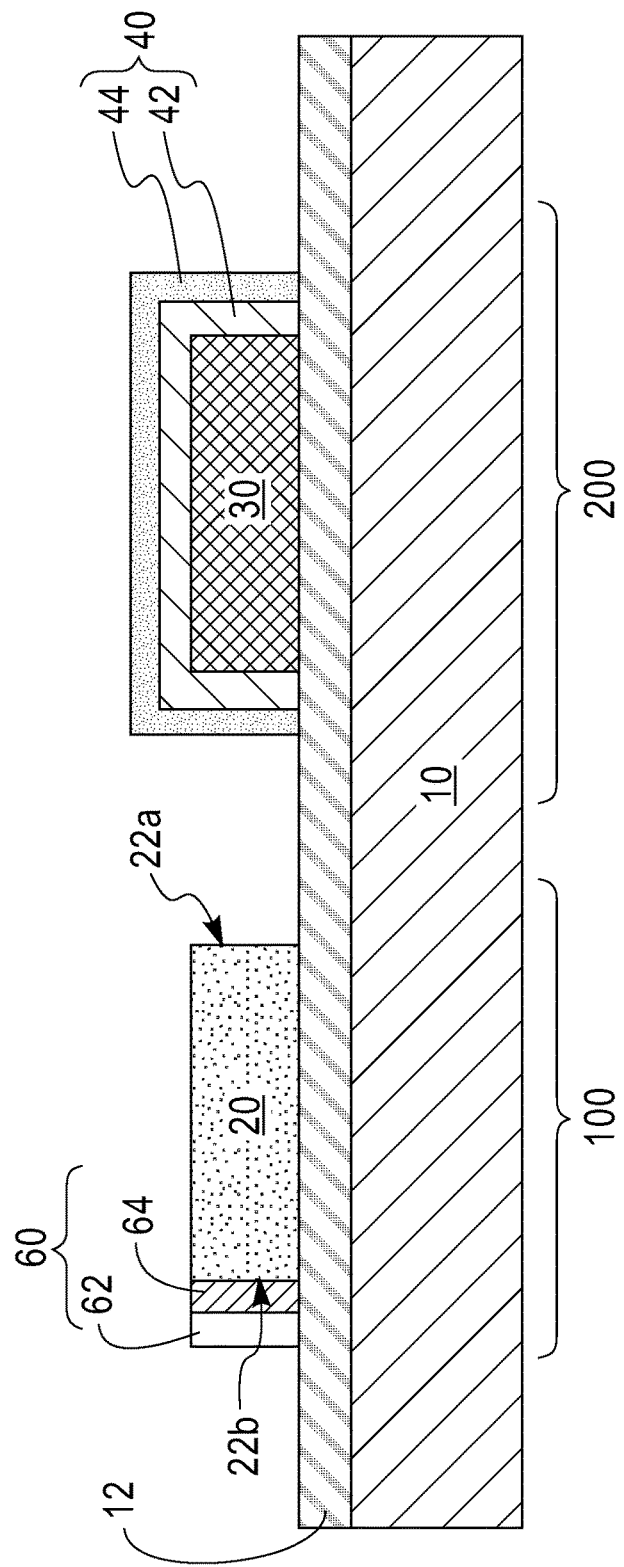
FIG. 11 is a cross-sectional view of the exemplary semiconductor structure of FIG. 10 after removing the etch stop layer portion from the anti-reflection coating.

Referring to FIG. 11, there is illustrated the exemplary semiconductor structure of FIG. 10 after removing the etch stop layer portion 50 from the anti-reflection coating 40. The etch stop layer portion 50 may be removed selective to the anti-reflection coating 40, the laser 20, the high reflection coating 60 and the semiconductor substrate 10 or the semiconductor seed layer 12, if present. In one embodiment, the etch stop layer portion 50 may be removed by a dry etch, such as RIE or a wet chemical etch.

In the present application, when the monolithically integrated device also includes other types of optical components, the same ALD and lithographic patterning processes as described above can be applied to form desirable optical coatings on the other types of optical components.

In the present application, by repeating the processes of depositing a respective coating layer over optical components that are present on a semiconductor substrate and lithographically patterning the coating layer, different types of optical coatings (e.g., anti-reflection coating and high-reflection coating) can be formed selectively on different types of optical components depending on the need. The wafer scale integration of optical components is thus achieved in a cost effective way.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   providing a laser in a first region of a semiconductor substrate and a modulator in a second region of the semiconductor substrate that is optically coupled to the laser, wherein the laser has a first facet on a first end of the laser that is proximal to the modulator and a second facet on a second end of the laser opposite the first end;
   forming an anti-reflection coating on exposed surfaces of the modulator;
   forming an etch stop layer portion over the anti-reflection coating; and
   forming a high reflection coating on the second facet of the laser, wherein the forming the high reflection coating on the second facet of the laser comprises:
      forming a high reflection coating layer on the etch stop layer portion, the laser and the semiconductor substrate, wherein the high reflection coating layer comprises at least a pair of a third coating layer and a fourth coating layer having different refractive indices, wherein the third coating layer contacts the exposed surfaces of the modulator
      forming a third mask layer over the high reflection coating layer,
      patterning the third mask layer to expose portions of the high reflection coating layer that are not present on the second facet of the laser,
      removing the exposed portions of the high reflection coating layer to provide the high reflection coating, and
      removing a remaining portion of the third mask layer.

2. The method of claim 1, wherein the forming the anti-reflection coating on the exposed surfaces of the modulator comprises:
   forming an anti-reflection coating layer over the modulator, the laser and the semiconductor substrate;
   forming a first mask layer over the anti-reflection coating layer;
   patterning the first mask layer to expose portions of the anti-reflection coating layer that are not present on the exposed surfaces of the modulator;
   removing the exposed portions of the anti-reflection coating layer to provide the anti-reflection coating; and
   removing a remaining portion of the first mask layer.

3. The method of claim 2, wherein the anti-reflection coating layer comprises at least one pair of a first coating layer and a second coating layer having different refractive indices, wherein the first coating layer contacts the exposed surfaces of the modulator.

4. The method of claim 3, wherein the first coating layer has a first refractive index, and the second coating layer has a second refractive index, wherein the first refractive index is greater than the second refractive index.

5. The method of claim 4, wherein the first coating layer comprises silicon nitride (SiN), hafnium oxide (HfO$_2$), titanium nitride (TiN), tantalum oxide (Ta$_2$O$_5$) or titanium oxide (TiO$_2$), and the second coating layer comprises silicon dioxide (SiO$_2$), aluminum oxide (Al$_2$O$_3$) or silicon oxynitride (SiON).

6. The method of claim 2, wherein the anti-reflection coating layer is formed by atomic layer deposition.

7. The method of claim 2, wherein the exposed portions of the anti-reflection coating layer is removed by reactive ion etching.

8. The method of claim 1, wherein the anti-reflection coating is in direct contact with sidewalls and a top surface of the modulator.

9. The method of claim 1, wherein the etch stop layer comprises amorphous silicon, copper or titanium nitride.

10. The method of claim 1, wherein the forming the etch stop layer portion comprises:
    forming an etch stop layer over the anti-reflection coating, the laser and the semiconductor substrate;
    forming a second mask layer over the etch stop layer;
    patterning the second mask layer to expose portions of the etch stop layer that are not present on the anti-reflection coating;
    removing the exposed portions of the etch stop layer to provide the etch stop layer portion; and
    removing a remaining portion of the second mask layer.

11. The method of claim 1, wherein the third coating layer has a third refractive index, and the fourth coating layer has a fourth refractive index, wherein the third refractive index is less than the fourth refractive index.

12. The method of claim 11, wherein the third coating layer comprises SiO$_2$, Al$_2$O$_3$ or SiON, and the fourth coating layer comprises SiN, HfO$_2$, TiN, Ta$_2$O$_5$ or TiO$_2$.

13. The method of claim 1, further comprising removing the etch stop layer portion from the anti-reflection coating after the forming the high reflection coating on the second facet of the laser.

14. The method of claim 1, further comprising forming the laser in the first region of the semiconductor substrate, wherein the forming the laser comprises:
    forming a material stack including, from bottom to top, a first bottom cladding layer, a first active layer and a first top cladding layer over an entire top surface of the semiconductor substrate, wherein the first bottom cladding layer, the first active layer and the first top cladding layer are epitaxially aligned with the semiconductor substrate; and
    lithographically patterning the material stack by reactive ion etching to form the laser in the first region of the semiconductor substrate.

15. The method of claim 1, further comprising forming the modulator in the second region of the semiconductor substrate, wherein the forming the modulator comprises:
    forming a dielectric oxide layer over the semiconductor substrate and the laser;
    patterning the dielectric oxide layer by an anisotropic etch to expose the second region of the semiconductor substrate, wherein the laser in the first region of the semiconductor substrate remains covered by the dielectric oxide layer; and
    forming the modulator comprising, from bottom to top, a second bottom cladding layer, a second active layer and a second top cladding layer on the second region of the semiconductor substrate, wherein the second bottom cladding layer, the second active layer and the second top cladding layer are epitaxially aligned with the semiconductor substrate.

16. The method of claim 1, further comprising forming a semiconductor seed layer on a top surface of the semiconductor substrate, wherein the semiconductor layer is epitaxially aligned with the semiconductor substrate, and the laser and the modulator are located on a top surface of the semiconductor seed layer.

17. The method of claim 16, wherein the semiconductor seed layer comprises Ge or SiGe.

* * * * *